US007685494B1

(12) United States Patent
Varnica et al.

(10) Patent No.: US 7,685,494 B1
(45) Date of Patent: Mar. 23, 2010

(54) ERROR CORRECTION CODING FOR VARYING SIGNAL-TO-NOISE RATIO CHANNELS

(75) Inventors: Nedeljko Varnica, Sunnyvale, CA (US); Gregory Burd, San Jose, CA (US); Zining Wu, Los Altos, CA (US)

(73) Assignee: Marvell International, Ltd., Hamilton (BM)

( * ) Notice: Subject to any disclaimer, the term of this patent is extended or adjusted under 35 U.S.C. 154(b) by 4 days.

(21) Appl. No.: 11/745,254

(22) Filed: May 7, 2007

Related U.S. Application Data

(60) Provisional application No. 60/798,667, filed on May 8, 2006.

(51) Int. Cl.
*H03M 13/00* (2006.01)

(52) U.S. Cl. .................................................. 714/752

(58) Field of Classification Search ............... 714/752, 714/704, 758
See application file for complete search history.

(56) References Cited

U.S. PATENT DOCUMENTS

| 6,985,437 | B1 * | 1/2006 | Vogel | 370/230 |
| 7,007,220 | B2 * | 2/2006 | Zhang et al. | 714/752 |
| 2003/0039317 | A1 * | 2/2003 | Taylor et al. | 375/295 |
| 2006/0135080 | A1 * | 6/2006 | Khandekar et al. | 455/69 |
| 2006/0242530 | A1 * | 10/2006 | Lu et al. | 714/752 |

OTHER PUBLICATIONS

John R. Barry, "Low-Density Parity-Check Codes," Georgia Institute of Technology, pp. 1-20, Oct. 5, 2001.
Nigel Boston, "Graph-Based Codes," Departments of Mathematics, Electrical and Computer Engineering, and Computer Sciences, University of Wisconsin, pp. 1-21, Jul. 12-15, 2004.
Bernhard M.J. Leiner, "LDPC Codes—a brief Tutorial," pp. 1-9, Apr. 8, 2005.
Michael G. Luby et al., "Improved Low-Density Parity-Check Codes Using Irregular Graphs," *IEEE Transactions on Information Theory*, vol. 47, No. 2, pp. 585-598, Feb. 2, 2001.
Thomas J. Richardson et al., "Design of Capacity-Approaching Irregular Low-Density Parity-Check Codes," *IEEE Transactions on Information Theory*, vol. 47, No. 2, pp. 619-637, Feb. 2, 2001.
Robert G. Gallager, "Low-Density Parity-Check Codes," pp. 1-90 (Jul. 1963).

* cited by examiner

*Primary Examiner*—Esaw T Abraham

(57) ABSTRACT

An error rate sensitive error correction (ERSEC) system that applies a level of error correction that is inversely related to susceptibility to error as indicated by a signal-to-noise ratio (SNR) profile of a channel. The SNR profile is estimated, detected or retrieved from an external source. The ERSEC system can be used with any channel for which the SNRs vary spatially, temporally or both.

25 Claims, 19 Drawing Sheets

324

| Pixel | Domain |
|---|---|
| 1 | 3 Bit ECC |
| 2 | 3 Bit ECC |
| 3 | 3 Bit ECC |
| 4 | 3 Bit ECC |
| 5 | 3 Bit ECC |
| 6 | 3 Bit ECC |
| 7 | 3 Bit ECC |
| 8 | 3 Bit ECC |
| 9 | 3 Bit ECC |
| 10 | 2 Bit ECC |
| 11 | 1 Bit ECC |
| 12 | 1 Bit ECC |
| 13 | 1 Bit ECC |
| 14 | 1 Bit ECC |
| 15 | 2 Bit ECC |
| 16 | 3 Bit ECC |
| 17 | 3 Bit ECC |
| 18 | 2 Bit ECC |
| 19 | 1 Bit ECC |
| 20 | 1 Bit ECC |
| 21 | 1 Bit ECC |
| 22 | 1 Bit ECC |
| 23 | 2 Bit ECC |
| 24 | 3 Bit ECC |
| 25 | 3 Bit ECC |
| 26 | 3 Bit ECC |
| 27 | 3 Bit ECC |
| 28 | 3 Bit ECC |
| 29 | 3 Bit ECC |
| 30 | 3 Bit ECC |
| 31 | 3 Bit ECC |
| 32 | 3 Bit ECC |

| Pixel | Domain |
|---|---|
| 1 | Domain 306 |
| 2 | Domain 306 |
| 3 | Domain 306 |
| 4 | Domain 306 |
| 5 | Domain 306 |
| 6 | Domain 306 |
| 7 | Domain 306 |
| 8 | Domain 306 |
| 9 | Domain 306 |
| 10 | Domain 304 |
| 11 | Domain 302 |
| 12 | Domain 302 |
| 13 | Domain 302 |
| 14 | Domain 302 |
| 15 | Domain 304 |
| 16 | Domain 306 |
| 17 | Domain 306 |
| 18 | Domain 304 |
| 19 | Domain 302 |
| 20 | Domain 302 |
| 21 | Domain 302 |
| 22 | Domain 302 |
| 23 | Domain 304 |
| 24 | Domain 306 |
| 25 | Domain 306 |
| 26 | Domain 306 |
| 27 | Domain 306 |
| 28 | Domain 306 |
| 29 | Domain 306 |
| 30 | Domain 306 |
| 31 | Domain 306 |
| 32 | Domain 306 |

FIG. 9

ERROR CORRECTION CODING FOR VARYING SIGNAL-TO-NOISE RATIO CHANNELS

INCORPORATION BY REFERENCE

This application claims the benefit of U.S. Provisional Application No. 60/798,667, "Methodology and Apparatus for Improved Code Design for Time or Space-Varying Channels with Known or Estimated SNR Patterns" filed on May 8, 2006, including all cited references which are incorporated herein by reference in their entirety.

BACKGROUND

Error correction coding techniques have been commonly used to reduce errors introduced during digital data transmission or storage. Prior to transmission, for example, each piece of data, such as a 16 bit word, may be encoded to incorporate additional information so that upon reception, the data may be recovered even when errors are introduced during transit between transmitter and receiver.

In 1962, Robert Gallager disclosed an error correction coding technique called low-density parity-check (LDPC) codes. LDPC codes are linear binary block codes whose codewords satisfy a set of M linear parity-check constraints. LDPC codes were largely forgotten after their initial disclosure due to lack of computing power, but were revived in the mid 1990's and have since been recognized to offer better performance and less decoding complexity than many later disclosed error correcting codes.

SUMMARY

An LDPC code is defined by a sparse M×N parity-check binary matrix (LDPC matrix). A regular LDPC code has an LDPC matrix in which each of its rows have the same number k of ones (1s), and each of the columns have the same number j of 1s, where j<k. An irregular LDPC code has an LDPC matrix in which not all rows and columns have the same number of 1s. The irregular LDPC code is applied in an error rate sensitive error correction (ERSEC) system disclosed herein that improves error correction effectiveness by allocating error correction resources based on error susceptibility.

For example, for certain channels signal-to-noise ratio (SNR) can be a measure of error susceptibility. For other channels, different measures may be more appropriate than SNR. When applied to a communication channel, the SNR may be determined, estimated, or detected to be different for different portions of a data stream so that errors may be more likely to be introduced in one portion of the data stream than other portions. The ERSEC system may allocate more robust error correction coding to those portions of the data transmission that may experience lower SNRs than other portions. Thus, the ERSEC system may encode data that is expected to experience lower SNR with greater error correction capability in an irregular LDPC, for example, than other portions for which higher SNRs are expected.

Correspondingly, in a storage medium application such as an optical disc (e.g., CD, DVD, holographic optical disc, etc.), different portions of the optical disc medium may be more error prone than other portions due to the physics of the read/write mechanisms or the materials of a particular optical disc, for example. The SNRs for different portions of the optical disc may be predetermined based on the optical disc/disc drive design, estimated based on past experience or detected by tests that determine bit-error-rates (BERs), for example. When digital data is written, the recorded bit stream may be written in tracks that extend through different SNR regions or domains. As in the communication channel example, the ERSEC system may encode the data bits with error correction capabilities that match the SNRs of the domains which the data bits are expected to experience.

In this way, the ERSEC system applies error correction resources adaptively with efficient use of resources to obtain low BERs.

BRIEF DESCRIPTION OF THE DRAWINGS

The error rate sensitive error correction (ERSEC) system will be described with reference to the following figures, wherein like numerals reference like elements, and wherein:

FIG. 9 shows an exemplary table showing a mapping of the two dimensional image pixels onto SNR domains of a holographic page;

FIG. 10 shows an exemplary table showing adaptive application of error correction coding to the two dimensional image pixels based on the SNR domains;

DETAILED DESCRIPTION OF EMBODIMENTS

Figure 1:
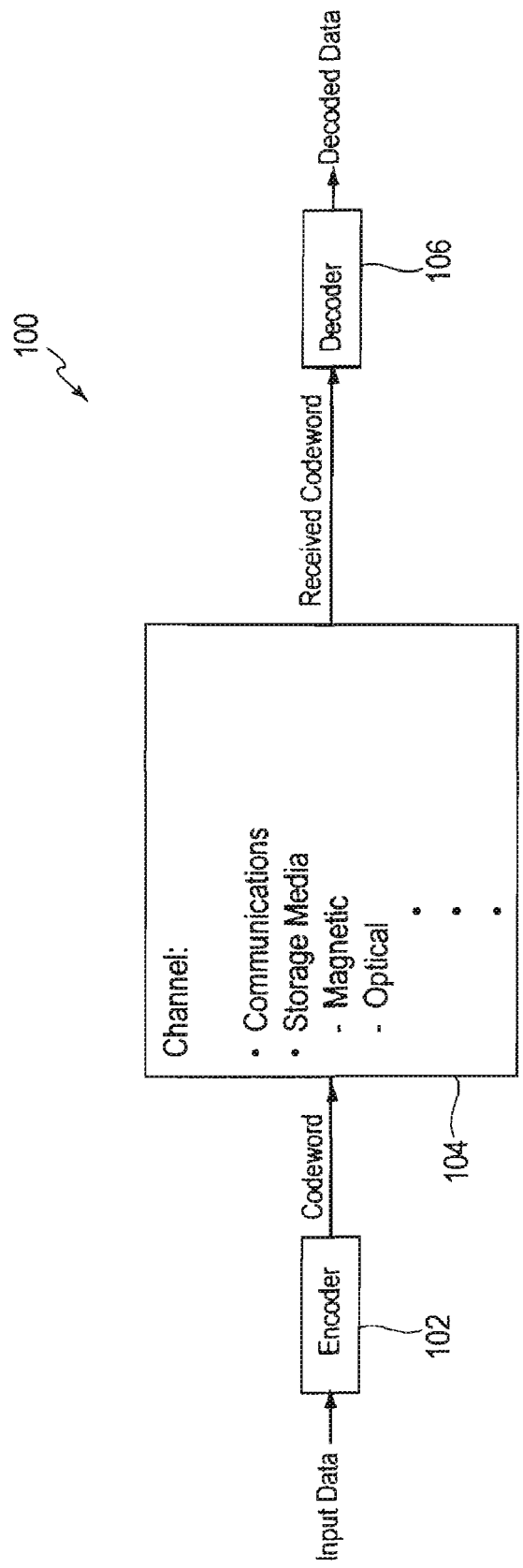
FIG. 1 shows an exemplary block diagram of an error rate sensitive error correction (ERSEC) system.

FIG. 1 shows an exemplary block diagram of an error rate sensitive error correction (ERSEC) system 100 that includes an encoder 102 and a decoder 106. Codewords output from encoder 102 are transmitted through a channel 104, received at decoder 106 as received codewords, decoded and outputted from decoder 106 as decoded data that corresponds to input data received by encoder 102. ERSEC system 100 sets parameters in encoder 102 and decoder 106 to protect different portions of the input data with different levels of error correction coding based on error susceptibility of each portion.

As indicated in FIG. 1, the word "channel" is used broadly to include communication channels such as digital wired or wireless communications over a network, for example, as well as any other system or device through which data is passed between encoder 102 and decoder 104. Data storage devices are channels within this broad meaning, for example. In this case, data may be encoded by encoder 102, stored on a storage medium, later retrieved from the storage medium, and decoded by decoder 106.

Figure 2:
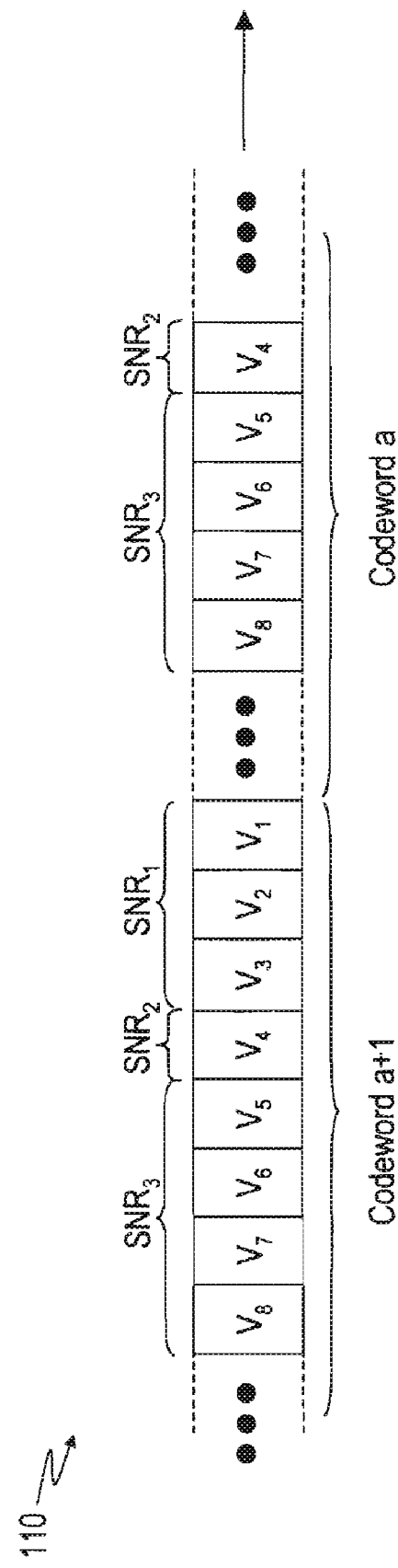
FIG. 2 shows an example of an ERSEC system transmission over a communication channel.

FIG. 2 shows an example of ERSEC system operation in a communication environment 110 using transmission media such as microwave, coaxial cable, computer network, satellite, etc. In FIG. 2, a baseband protocol is used as an example where binary codewords "a" and "a+1" are transmitted in blocks of ones (1s) and zeros (0s) indicated as $V_1, V_2, \ldots$ Bits $V_1$-$V_3$ are expected to experience $SNR_1$, $V_4$ is expected to experience $SNR_2$, and $V_5$-$V_8$ are expected to experience $SNR_3$, where $SNR_1 > SNR_2 > SNR_3$, for example. Based on this SNR profile, ERSEC system 100 sets parameters of encoder 102 to encode $V_1$-$V_3$ using a low level of error correction, $V_4$ using a medium level of error correction, and $V_5$-$V_8$ using a high level of error correction so that the BER of the transmission over channel 104 is reduced when compared to applying a constant level of error correction that corresponds to an average SNR for channel 104, for example.

The SNR profile may be estimated for a particular channel. For example, in a communication channel over computer networks, the SNR for each portion of a data transmission may be affected by known mechanisms that are dependent on the position of bits in particular locations within a codeword. For example, in baseband protocols, a clock signal is often retrieved from the received bits, and depending on a particular clock retrieval scheme, different bits in a data stream may be more or less susceptible to reception error. Thus, an SNR profile may be estimated for each bit position of a data stream for the entire transit from encoder 102 to decoder 104.

Figure 3:
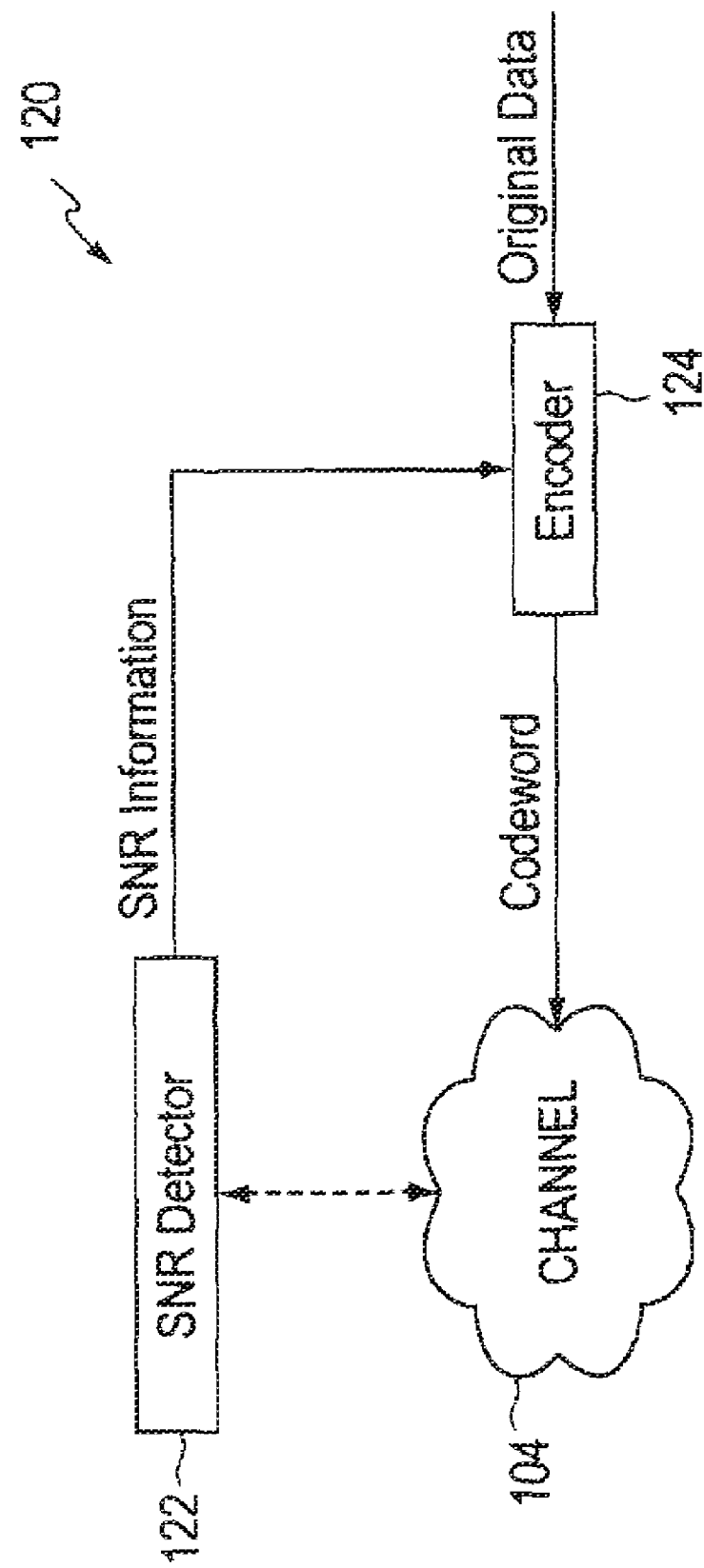
FIG. 3 shows an exemplary block diagram of SNR detection for adaptive encoding.

Transmitting and receiving test data streams, for example, may also detect the SNR profile. FIG. 3 shows an exemplary SNR detection system 120 that includes an SNR detector 122 and an encoder 124. Based on BERs obtained using the test data streams, SNR detector 122 may generate an SNR profile and send it to encoder 124 for updating assignment of error correction levels to codeword bits, for example. SNR detector 122 may be part of a communication network such as a base station for cell phone communications, for example. Alternatively, SNR detector 122 may be incorporated in encoder 124, so that periodically, encoder 124 may execute an error correction level update cycle to "sample" a current SNR profile. In this way, encoder 124 may adapt to changing SNR environment to achieve a lower BER than non-adaptive error correction systems.

For a storage medium channel, the SNR profile may be determined by the manufacturer and stored in the storage medium, or determined by a recording device prior to recording, for example. Similar to determining bad portions of a magnetic disk where 1s are written over portions of tracks that have non-usable portions, a recording device may write and then read test data for a specific media and determine the SNR profile. A dedicated portion of the storage media may be set aside to storing error correction parameters where the SNR profile, encoding, and/or decoding parameters may be store as a look-up table, for example.

Figure 4:
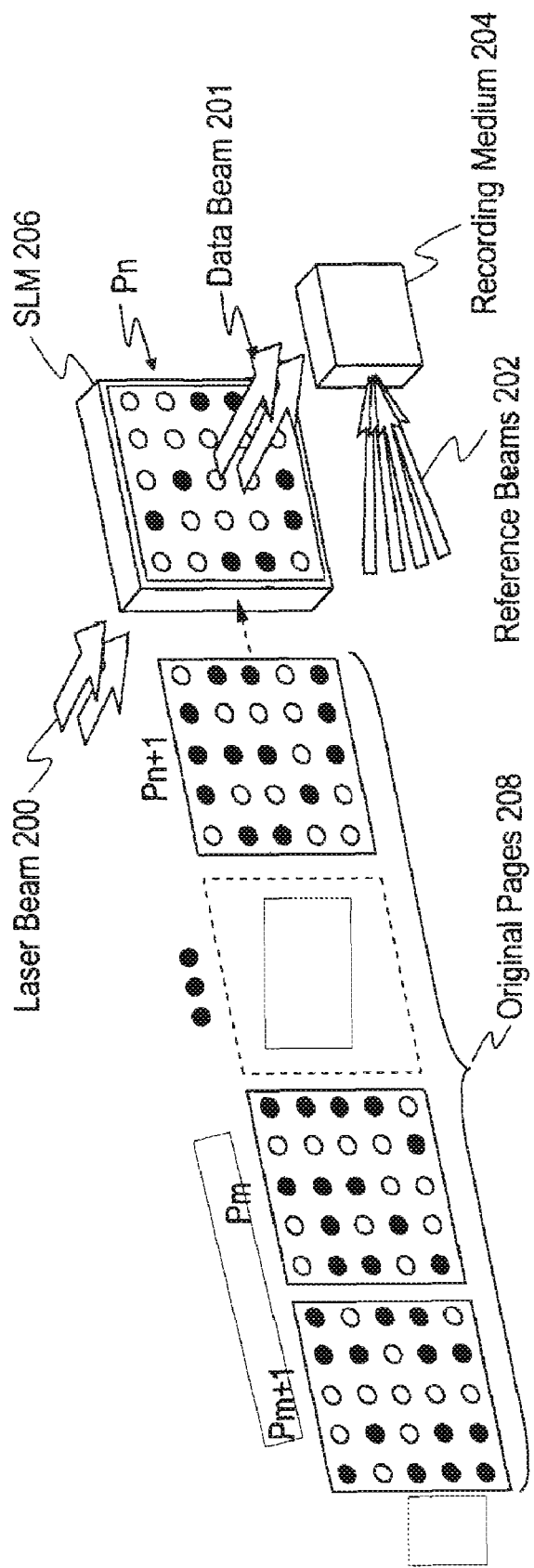
FIG. 4 shows an exemplary holographic recording system.
Figure 5:
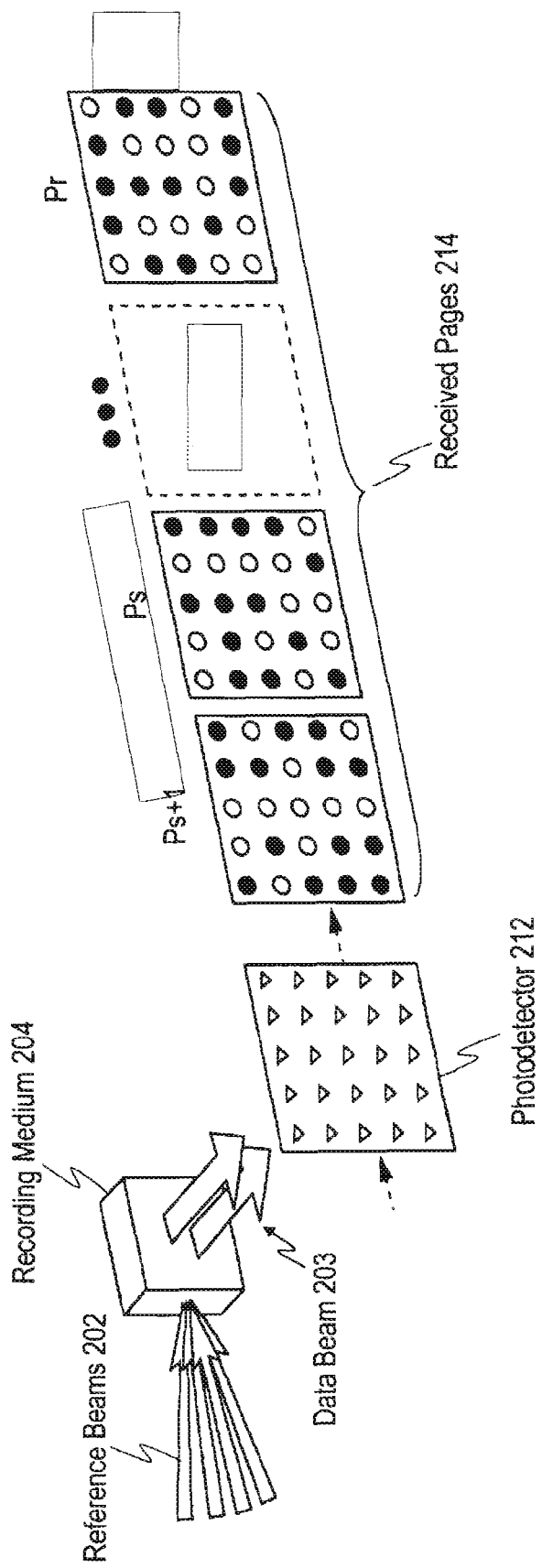
FIG. 5 shows an exemplary holographic retrieval system.

For ease of illustration and obtaining advantages of a concrete example, the operations of ERSEC system 100 is discussed below in the context of a holographic storage medium that can store data in the form of two-dimensional images called pages. FIG. 4 shows an example of a holographic storage system that includes a spatial light modulator (SLM) 206 which is illumined by a laser beam 200 to form a data beam 201. Data beam 201 illuminates a recording medium 204 at a selected writing location. The same writing location is also illuminated by one of many reference beams 202 directed at a particular angle to form an interference pattern that is recorded in recording medium 204 as a hologram. A first set of multiple original pages 208 (e.g., Pn–Pm–1) may be stored as holograms at the same selected writing location of SLM 206, where each of the first set of original pages 208 are stored using a different one of reference beams 202 directed at a unique angle, for example. After all of reference beams 202 are used, an adjacent writing location may be selected for recording a next set of original pages 208 (e.g., Pm, Pm+1, . . . ).

As shown in FIG, 5, recorded pages may be retrieved by illuminating recording medium 204 with one of reference beams 202 at a selected reading location and the writing angle to generate data beam 203 that is imaged onto a sensor 212 such as a photodetector array, for example. Sensor 212 converts data beam 203 into a page, and after multiple conversions, sets of received pages 214 (e.g., Pr–Ps–1; Ps, Ps+1, . . . ) are formed.

Recorded holograms of different reference beams 202 and holograms of adjacent writing locations may introduce errors when reading a page from recording medium 204. Such susceptibility to errors may be represented by one or more SNRs. For example, an SNR of a central portion of a page may be higher than at page edges, and worst at page corners due to influence of three adjacent pages. Thus, an SNR profile may be generated based on BERs of different positions within a page.

Figures 6, 7:
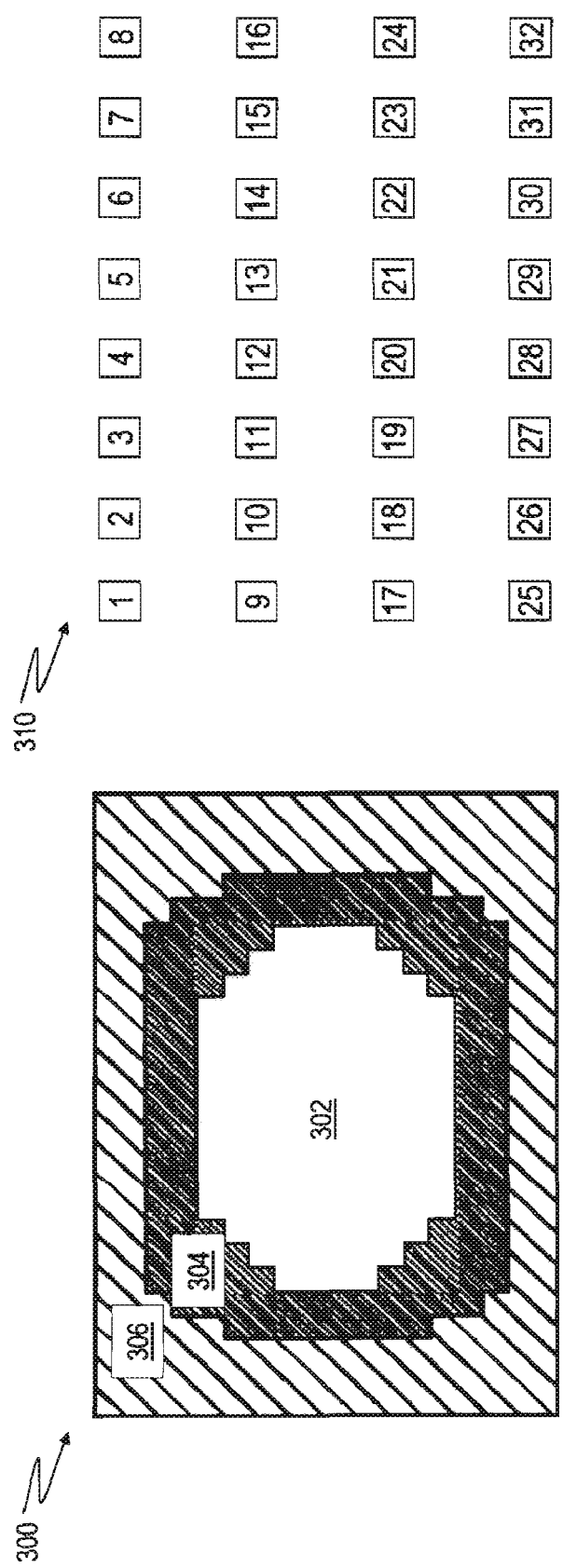
FIG. 6 shows an exemplary SNR profile for a holographic page.
FIG. 7 shows an exemplary two-dimensional image pixels arranged in a matrix format.

FIG. 6 shows an exemplary SNR profile for a page 300 in recording medium 204. While the SNR may vary in a continuous manner across page 300, FIG. 6 shows an SNR profile having three domains 302, 304 and 306 as an example, where a single average SNR is assigned to each domain 302-306. The presence of numerous SNR values within page 300 may be accounted for by defining contours of domains 302-306 based on a range of SNR values, or defining the contours of domains 302-306 by an SNR tolerance value (i.e., ±5.0%). However, in this example, domain 302 is associated with $SNR_1$, domain 304 is associated with $SNR_2$, and domain 306 is associated with $SNR_3$, and $SNR_1 > SNR_2 > SNR_3$. This SNR profile may be stored in recording medium 204 at a predetermined location so that recording devices implementing the ERSEC system may access the SNR profile to encode data with different error correction levels according to expected error rates based on the SNR profile.

FIG. 7 shows a two-dimensional pixel image 310 that is to be written into page 300. Pixel image 310 may be an image of a document page or a video frame of a movie, for example. For simplicity of discussion, pixel image 310 is shown to include information that corresponds to 32 pixels arranged in a matrix format instead of a 1024×768 matrix image of 786,432 pixels of a computer screen, for example. If pixel image 310 is a Red-Green-Blue (RGB) color image, then each pixel may be represented by three 8-bit values forming a 24-bit unit of information. Thus, each row of 8 pixels may be represented by 192 bits, and pixel image 310 may be represented by 768 bits.

Figure 8:
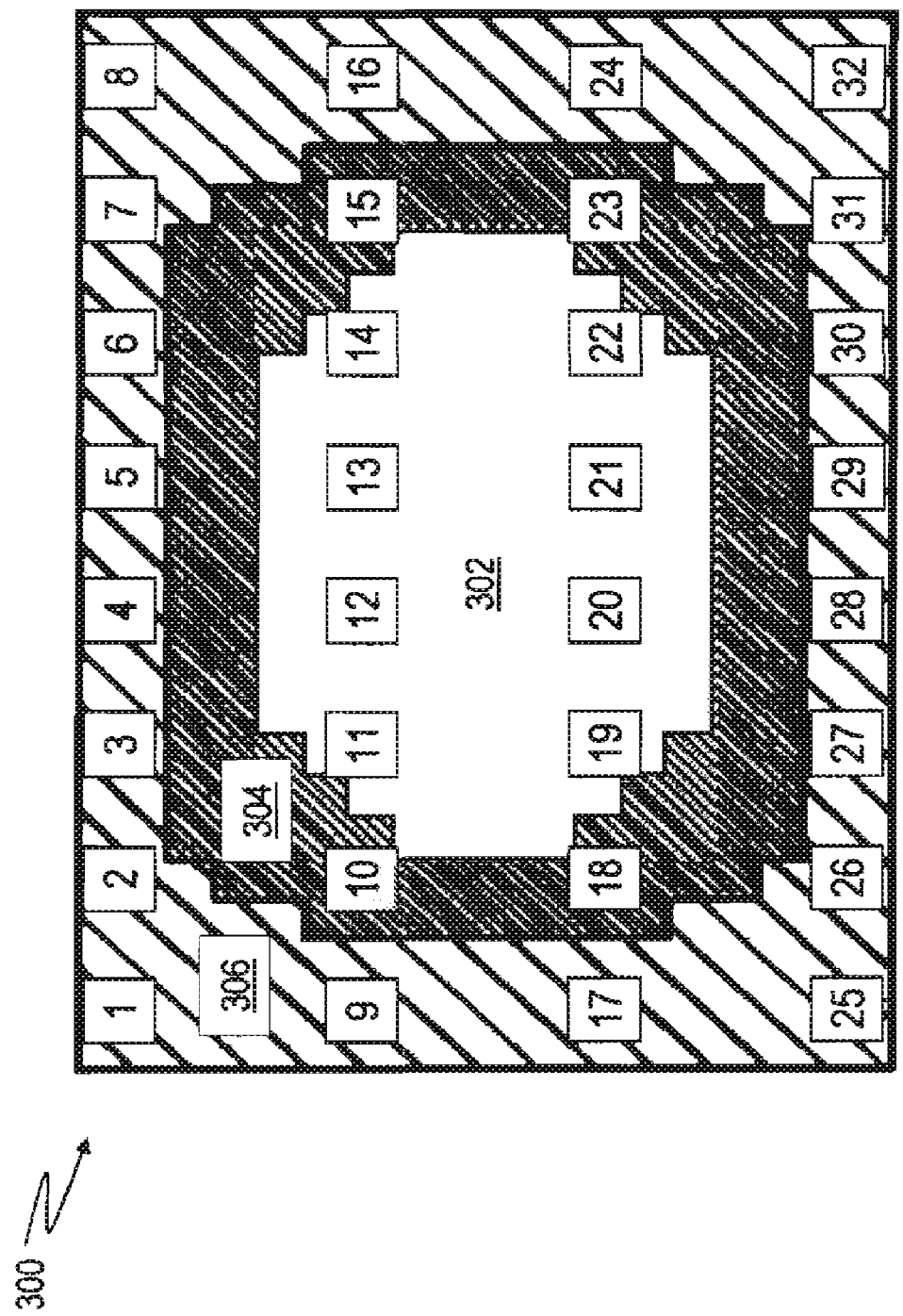
FIG. 8 shows an exemplary mapping of the two dimensional image pixels onto a holographic page.

FIG. 8 shows page 300 when written with pixel image 310. Pixels 1-8, 9, 16, 17, 24, and 25-32 are written into domain 306; pixels 10, 15, 18 and 23 are written into domain 304; and pixels 11-14 and 19-22 are written into domain 302. This correspondence between pixels 1-32 and domains 302-306 may be saved in a table such as table 322 shown in FIG. 9. Based on the information in table 322 and the SNR profile discussed above, ERSEC system 100 may assign error correction coding levels shown in FIG. 10, if Hamming coding is used, for example. Thus, pixels to be written in domain 306 may be assigned a high level 3 bit error correction coding (ECC); pixels to be written in domain 304 may be assigned a medium level 2 bit ECC; and pixels to be written in domain 302 may be assigned a low level 1 bit ECC. The specific levels of ECC are shown as an example. In actual implementations, other appropriate values may be used based on actual SNR profiles, domain contours, available processing power, specific error correction coding techniques, etc.

Additionally, the different levels of error correction coding may also be implemented using different coding techniques for some or all of the levels. For example, three codes can be prepared for different SNRs: Code 1, Code 2, Code 3, where Code 1 has greater correction capability than Codes 2 and 3, and Code 2 has greater correction capability than Code 3. Subsequently, Code 1 can be used in regions where low SNR is detected/estimated, Code 2 in regions where medium SNR is detected/estimated and Code 3 in regions where high SNR is detected/estimated. Thus, with reference to FIG. 8 pixels to be written to domain 306 may be assign a Code 1 error correction coding; pixels written to domain 304 may be assigned a Code 2 error correction coding; and pixels to be written to domain 302 may be assigned a Code 3 error correction coding.

Examples are provided below for implementing ERSEC system 100 using irregular LDPC codes which are linear block codes that includes sparse parity check matrices (H). Codewords of a LDPC code are generated in an encoder by matrix multiplying a block of input data m (e.g., a video frame) by a generator matrix G, as follows:

$$\text{codeword} = G \times m. \quad (1)$$

Parity-check matrix (H-matrix) has the following property:

$$H \times \text{codeword} = 0. \quad (2)$$

Generally, the H-matrix is not unique and thus, for any specific application, an appropriate H-matrix may be selected. As discussed below, an H-matrix may be selected so that a mixture of variable node degrees is consistent with desired levels of error correction.

When a transmitted codeword is received (received-codeword) over a channel and errors were introduced, H×received-codeword may not equal to 0. However, an iterative message passing decoding process may be performed that can correct errors in the received-codeword so that the input data may be recovered within an acceptable level of confidence.

Figure 11:
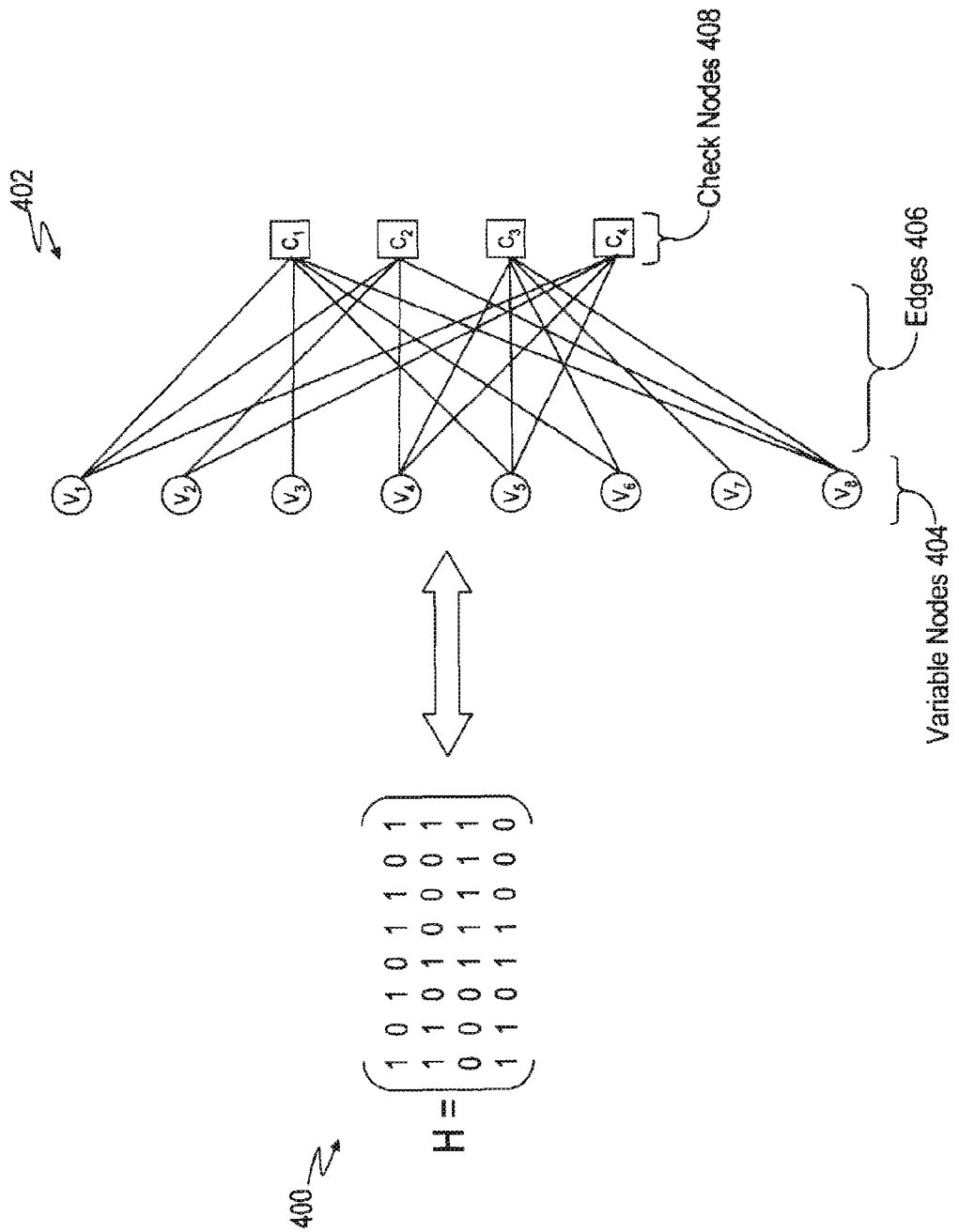
FIG. 11 shows a first exemplary parity-check matrix and a corresponding Tanner graph.

FIG. 11 shows an example H-matrix 400 to facilitate discussion. H-matrix 400 is not an actual H-matrix because an actual H-matrix is sparse which means that a number of 1s in each row and the number of 1s in each column are small compared to the number of rows in the actual H-matrix, for example.

H-matrix 400 may be represented as a Tanner graph 402, where variable nodes 404, indicated as $V_1$-$V_8$, represent bits of the receive-codeword and correspond to columns of H-matrix 400. Check nodes 408 correspond to rows of H-matrix 400. Edges 406 connect each variable node 404 with at least one of check nodes 408 as indicated by row positions of the 1s in the column that corresponds to each variable node 404. A number of edges 406 connected to a variable node 404 is referred to as a degree of the variable node 404. For Tanner graph 402, variable node $V_1$ has a degree of 3, variable node $V_2$ has a degree of 2, variable node $V_3$ has a degree of 1, and so on. In a given Tanner graph, the error correction capability that corresponds to a variable node 404 typically increases as the degree of that variable node 404 increases. Thus, as discussed below, within the context of LDPC codes, ERSEC system 100 assigns bits of a codeword that require greater error correction capacity to variable nodes 404 that have greater degrees.

Figure 12:
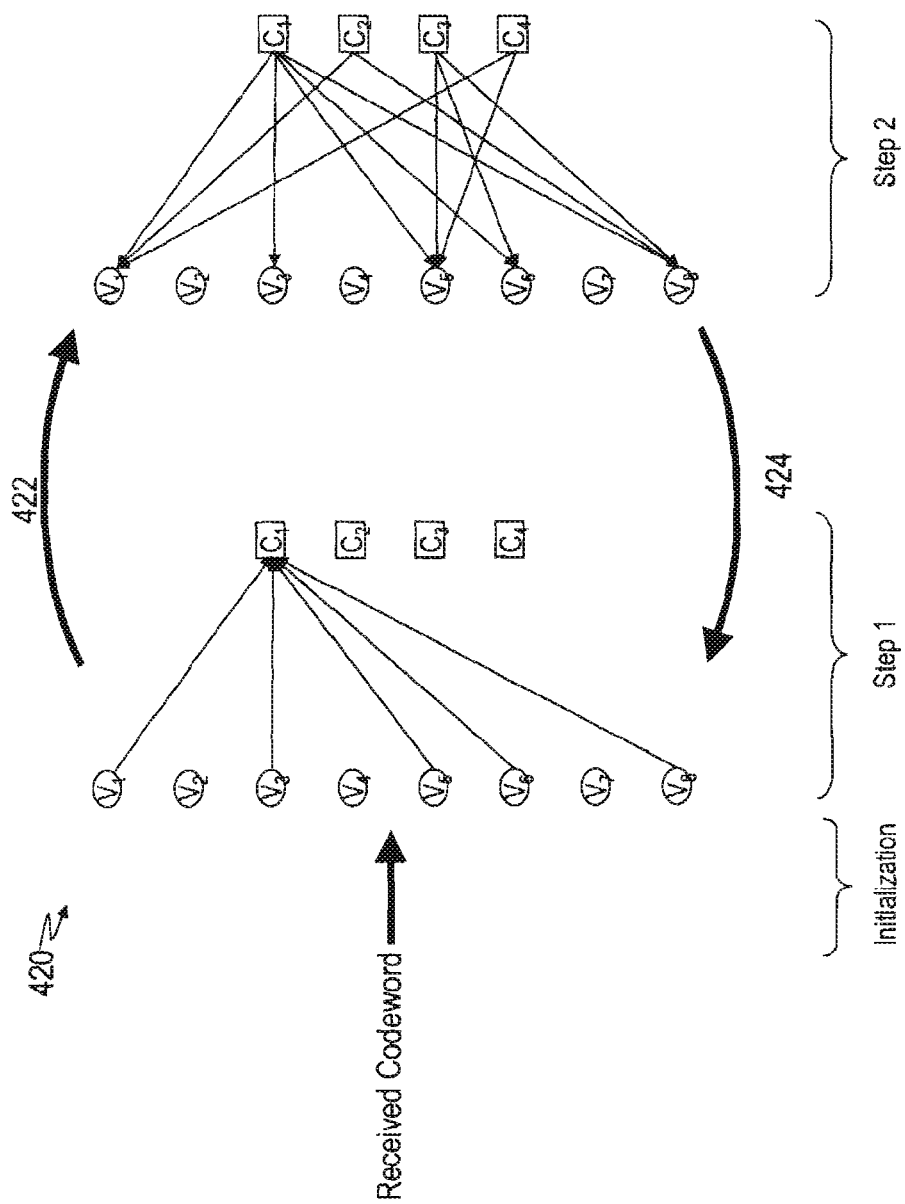
FIG. 12 shows an exemplary diagram of an iterative message passing decoding process.

FIG. 12 shows a diagram 420 of the iterative message passing process mentioned above that follows the process for check node $C_1$ and variable $V_1$ for one iteration. The process is an exemplary description of a hard decoding algorithm, and is as follows:

Initially, variable nodes $V_1$-$V_8$ are loaded with corresponding bits of a received-codeword. For example, if the received-codeword is 11010011, then $V_1$ is set to a 1, $V_2$ is set to a 1, $V_3$ is set to a 0, $V_4$ is set to a 1, $V_5$ is set to a 0, $V_6$ is set to a 0, $V_7$ is set to a 1, and $V_8$ is set to a 1;

In step 1 of the process, each variable node 404 evaluates a correct value of the originally transmitted codeword bit that corresponds to the variable node 404. In the first step 1 that follows immediately after initialization, the received-codeword bit that is loaded is assumed to be the correct value. For subsequent execution of step 1, each variable node 404 may simply return to connected check nodes 408 a value that is received from a larger number of connected check nodes 408 after execution of a step 2 described below. The evaluated correct value is sent via a message to check nodes 408 that are connected by an edge 406 to each variable node 404. Thus, in FIG. 12, $V_1$, $V_3$, $V_5$, $V_6$, and $V_8$ sends 1, 0, 0, 0, and 1, respectively to check node $C_1$;

In step 2, each check node 408 evaluates for each connected variable node 404, a value that the variable node 404 must have to achieve correct parity (even parity, for example) based on the variable node values sent to the check node 408 by all other variable nodes 404 that are connected to the check node 408. The values determined in this way are known as extrinsic messages, as they are based on the information from all neighboring nodes except the one to which the information is returned. The determined extrinsic value (which are not necessarily the same) for each of the variable nodes 404 is returned to each of the connected variable nodes. Thus, the values sent back to the variable nodes $V_1$, $V_3$, $V_5$, $V_6$, and $V_8$ are: 1, 0, 0, 0, 1, respectively; and Steps 1 and 2 are repeated until a confidence level exceeds a predetermined value which indicates that the value for each of the variable nodes 404 is correct, or until a predefined number of decoding iterations is reached. In this example, the originally loaded values for $V_1$, $V_3$, $V_5$, $V_6$, and $V_8$ appear to be correct and the process ends in only one cycle (iteration) if based only on the operation of check node $C_1$. However, Tanner graph 402 includes many more edges 406 and check nodes 408, and the result of all the check nodes 408 must exceed the required confidence level before the iterations of steps 1 and 2 can be stopped.

While the above-described decoding process makes "hard-decisions" in each of the steps 1 and 2, a "soft-decision" may be used in which probability mass function (PMF) (i.e., the probabilities whether a bit-value is a 1 or a 0) is used. For example, instead of initializing variable nodes 404 with bits of the received-codeword, PMF of whether a variable node 404 is a 1 or a 0 is provided as inputs. The initial PMFs loaded into variable nodes 404 may be determined based on the received real-values and on an SNR and other channel characteristics, for example. Check nodes 408 calculates PMFs for each of the connected variable nodes 404 (i.e., the PMFs of whether the value of each variable node 404 should be a 1 or a 0). The extrinsic PMFs calculated by check nodes 408 can be sent back to variable nodes 404. These PMFs can then be used to compute the new PMFs that are sent back to check nodes, and so on. The decoding procedure stops when the PDFs for the values of all variable nodes 404 exceed a threshold value or confidence level or when the maximum (predefined) number of iterations is reached.

Figure 13:
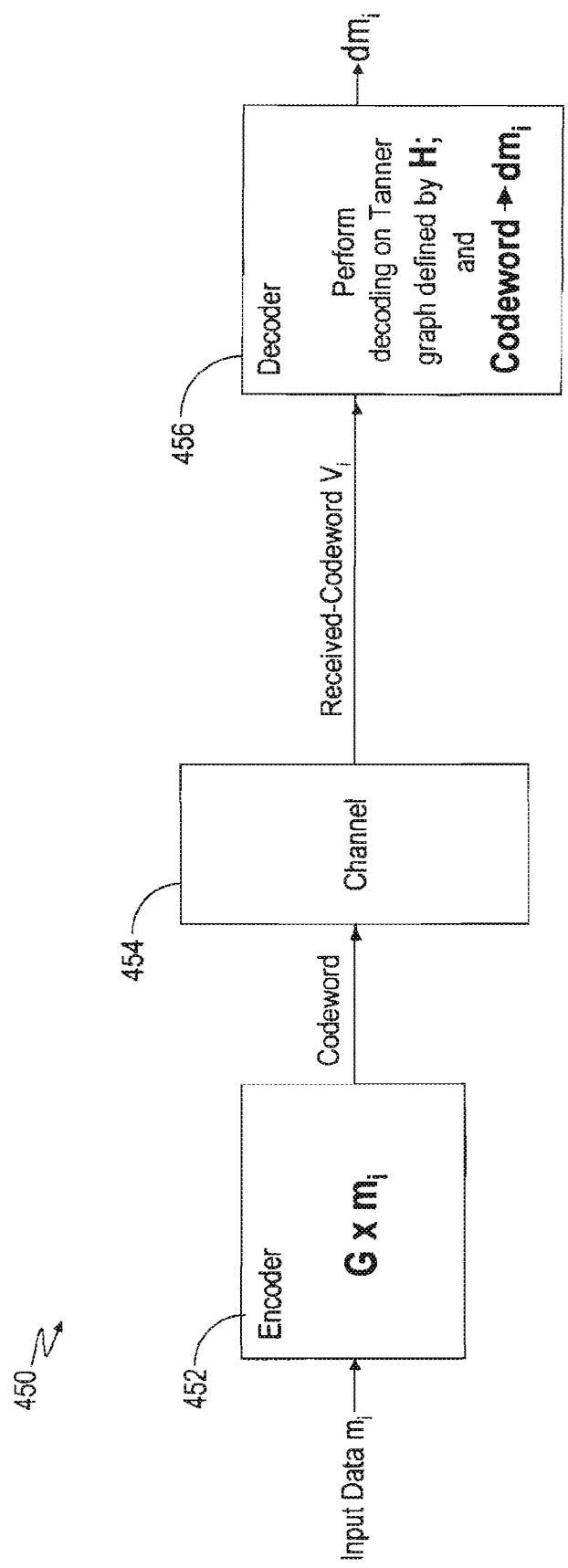
FIG. 13 shows an exemplary ERSEC system employing Low-Density Parity-Check (LDPC) encoding and decoding.

FIG. 13 shows a block diagram of an exemplary ERSEC system 450 using LDPC coding that includes an encoder 452, a channel 454 and a decoder 456. As in FIG. 1, channel 454 may include any medium or device that data must transit between encoder 452 and decoder 456. Encoder 452 receives original input data m, and generates codewords for each block of input data by performing matrix multiplication as shown in equation (1). The codewords are transmitted over channel 454, received at decoder 456 as received-codewords, and decoded by first performing the iterative message passing process described above to obtain retrieved-codewords, and decoding the retrieved-codewords into decoded-data $dm_i$.

Figure 14:
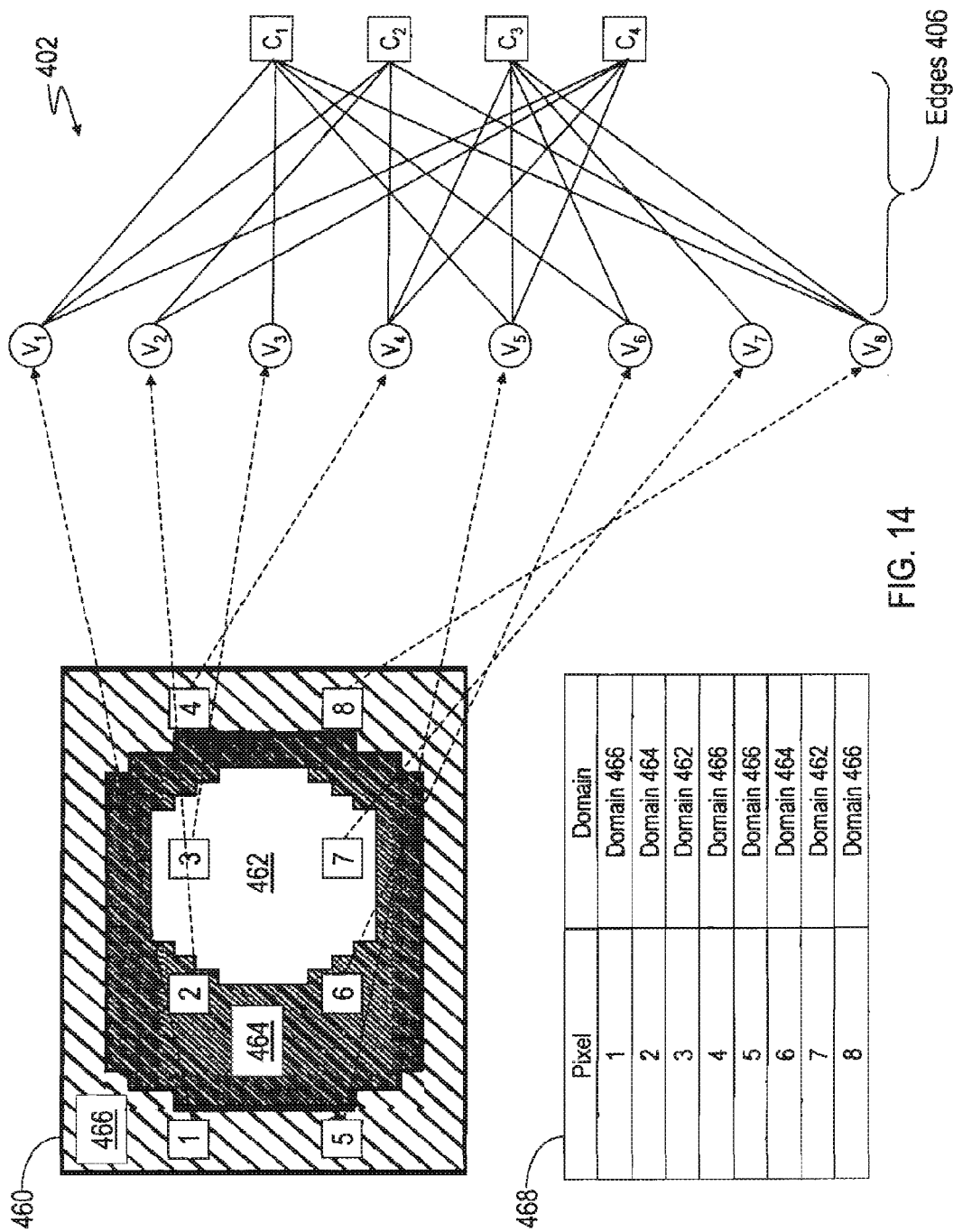
FIG. 14 shows a first exemplary pixel-to-variable node-mapping scheme.

FIG. 14 shows an exemplary page 460 of a holographic recording medium that has SNR domains 462-466. The contour of domain 462 is not centered as was the case for domain 302 of FIG. 6 to illustrate that the contours of domains may not have any particular configurations and can vary from page to page. Also, similar to page 300 of FIG. 6, domain 462 has a high SNR, domain 464 has an intermediate SNR and domain 466 has a low SNR. For this example, pixels 1-8 are individual bits 1-8 of a codeword and may be written into page 460 at positions as shown. Thus, bits 1, 4, 5 and 8 are written into domain 466, bits 2 and 6 are written into domain 464 and bits 3 and 7 are written into domain 462. This mapping of pixels 1-8 is shown in table 468.

Assuming H-matrix 400 of FIG. 11 is the parity-check matrix, then bits 1-8 are mapped into variable nodes $V_1$-$V_8$ of Tanner graph 402 as shown by dashed lines, and the variable nodes $V_1$-$V_8$ are connected to check nodes $C_1$-$C_4$ by edges 406. Consistent with the LDPC coding scheme discussed above, pixels located in a domain having a high SNR are mapped to variable nodes that have a low degree (i.e., a smaller number of emanating edges 406), while pixels located in a domain having a low SNR are mapped to variable nodes having a high degree (i.e., a larger number of edges 406). As shown, pixels 3 and 7 that are located within domain 462 are mapped to variable nodes $V_3$ and $V_7$, respectively, each of which has one edge 406; pixels 2 and 6 located within domain 464 is mapped to variable nodes $V_2$ and $V_6$, respectively, each of which has two edges 406; and pixels 1, 4, 5 and 8 located within domain 466 are mapped to variable nodes $V_1$, $V_4$, $V_5$, and $V_8$, respectively, each of which has three edges 406.

Figure 15:
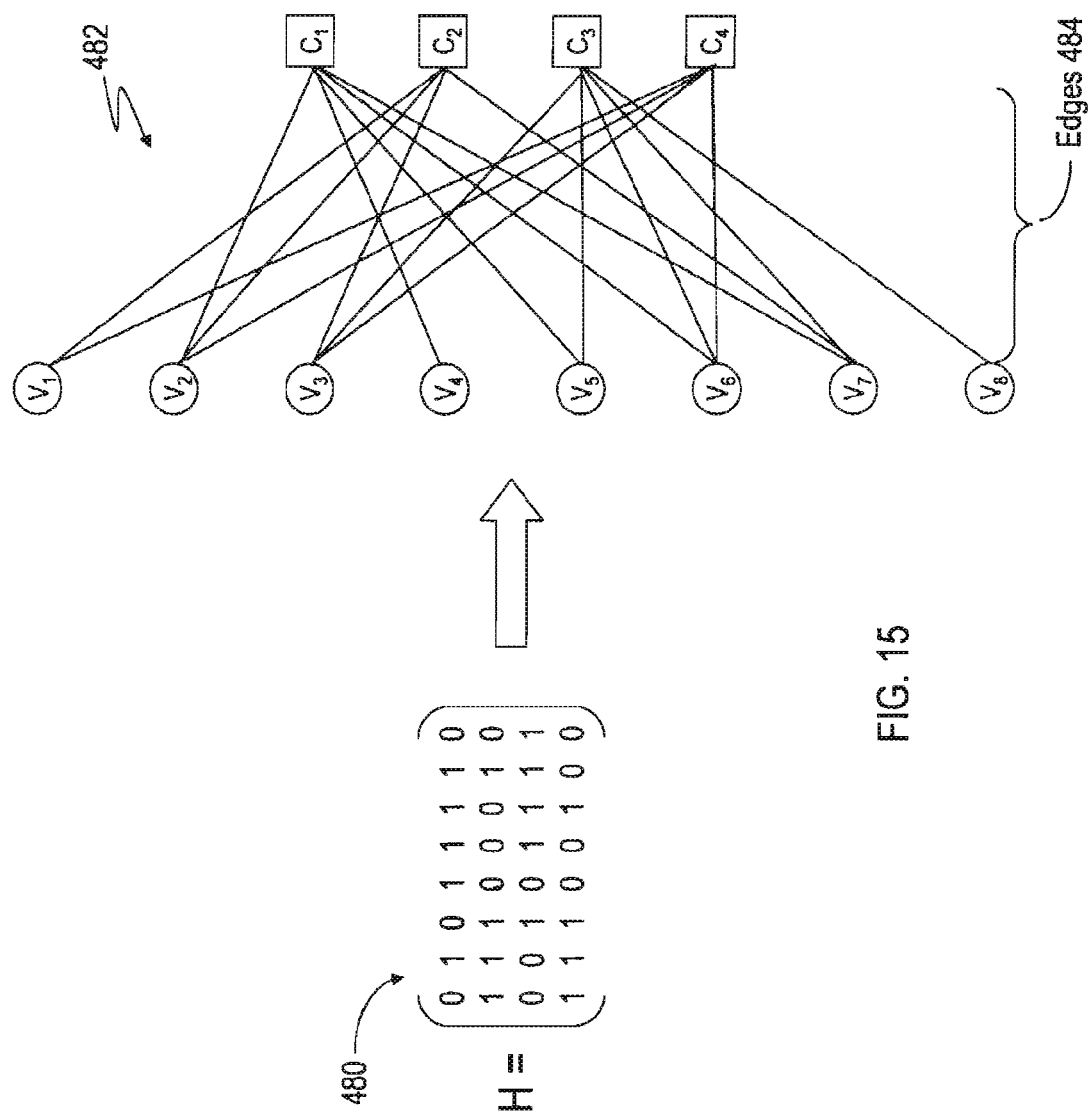
FIG. 15 shows a second exemplary parity-check matrix and a corresponding Tanner graph.
Figure 16:
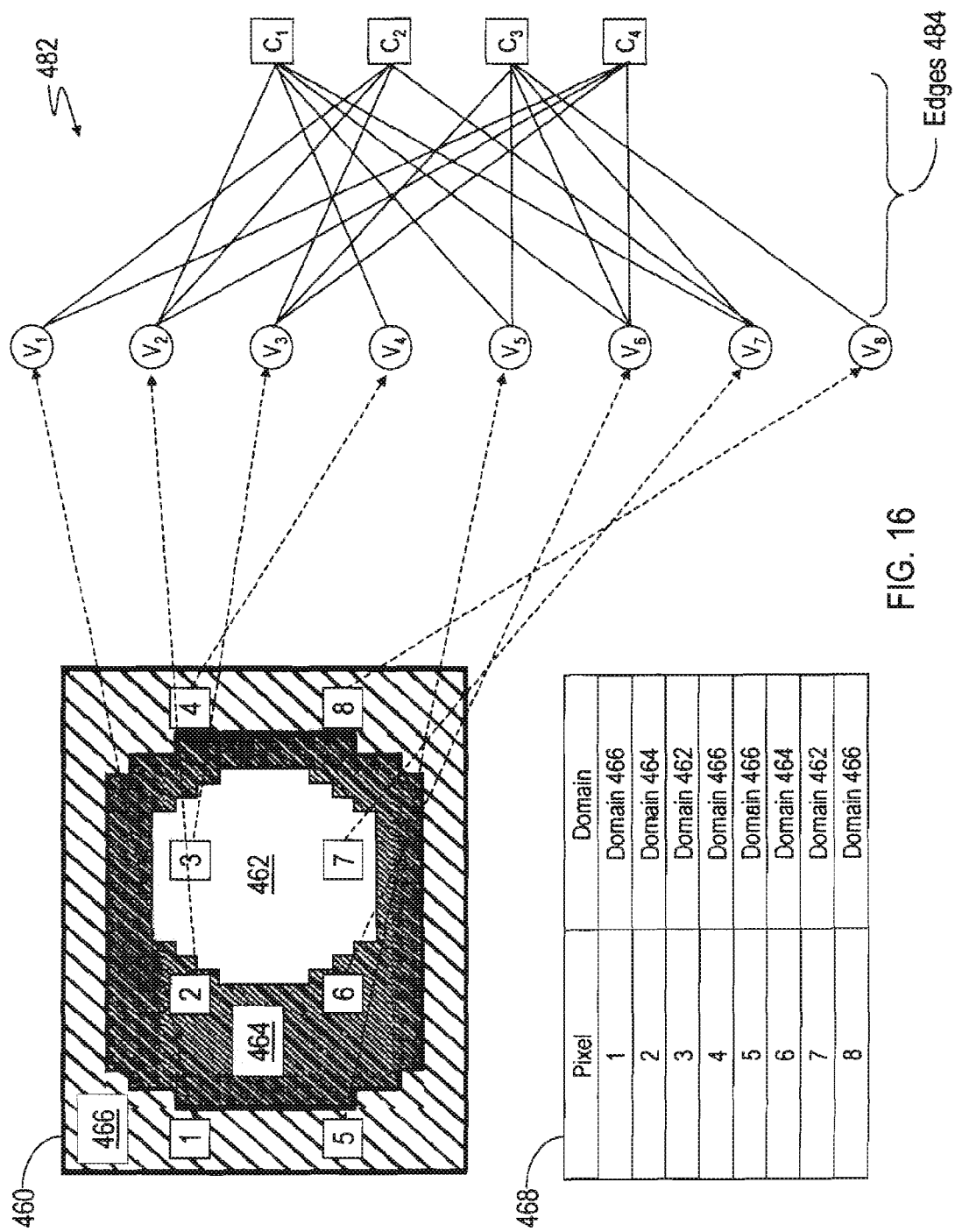
FIG. 16 shows the first exemplary pixel-to-variable node-mapping scheme with the second exemplary parity-check matrix.

FIG. 15 illustrates another possible H-matrix 480 and a corresponding Tanner graph 482. Again, as with H-matrix 400, H-matrix 480 is not an actual H-matrix, but is used to illustrate mapping of pixel bits of a codeword to variable nodes $V_1$-$V_8$. FIG. 16 shows positions of pixel bits 1-8 in page 460 to be the same as that shown in FIG. 14 having the same table 468 of pixel bits to domain mapping. However, when the pixel bits are mapped into variable nodes $V_1$-$V_8$ of Tanner graph 482 having edges 484, bits 1, 4, 5, and 8 that require a high level error correction are mapped into variable nodes $V_1$, $V_4$, $V_5$, and $V_8$, which has degrees 2, 1, 2 and 1, respectively. Further, bits 3 and 7 which require only a low level of error correction are mapped into variable nodes $V_3$ and $V_7$ each of which has a degree of 3. Thus, given H-matrix 480, the mapping of pixels 1-8 must be changed so as to position each of the pixels 1-8 in appropriate domains 462-466 so that the degree of variable nodes $V_1$-$V_8$ may match the needed level of error correction.

Figure 17:
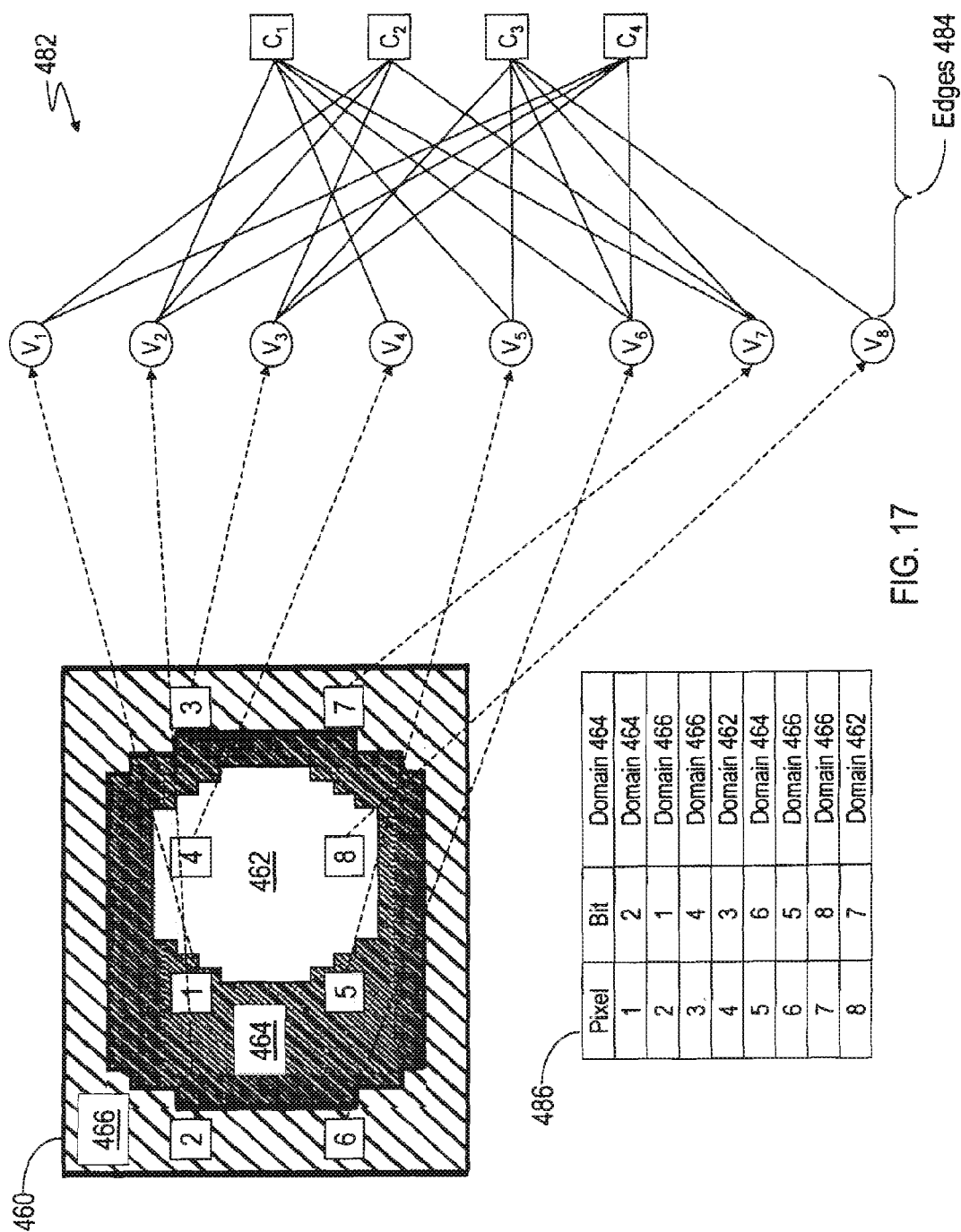
FIG. 17 shows a second exemplary pixel-to-variable node mapping scheme with the second exemplary parity-check matrix.

FIG. 17 shows another exemplary mapping of pixels 1-8 into domains 462-466 that aligns the degrees of variable nodes $V_1$-$V_8$ with needed levels of error correction for bits 1-8. Table 486 shows a mapping of pixels 1-8 to bits 1-8 of the codeword and domains 462-466. As shown, positions of bits 2 and 6 are switched with positions of bits 1 and 5 from that of FIG. 16 so that bits 2 and 6 may be positioned in domain 466 instead of domain 464 because bits 2 and 6 must be associated with variable nodes $V_2$ and $V_6$, respectively, which each has a degree of 3, thus providing the needed high level of error correction. Bits 1 and 5 are now positioned in domain 464 which requires intermediate level of error correction and are now associated with variable nodes $V_1$ and $V_5$, each of which has a degree of 2. Positions of bits 3 and 7 are switched with positions of bits 4 and 8 of FIG. 16 for similar reasons.

In view of the relationship between variable node degrees and levels of error correction, an H-matrix should be selected so that a mixture of variable node degrees is consistent with needed levels of error correction. After an H-matrix is obtained, bits of the codeword should be mapped into domains that result in desired levels of error correction based on the degrees of variable nodes as specified by the H-matrix.

Figure 18:
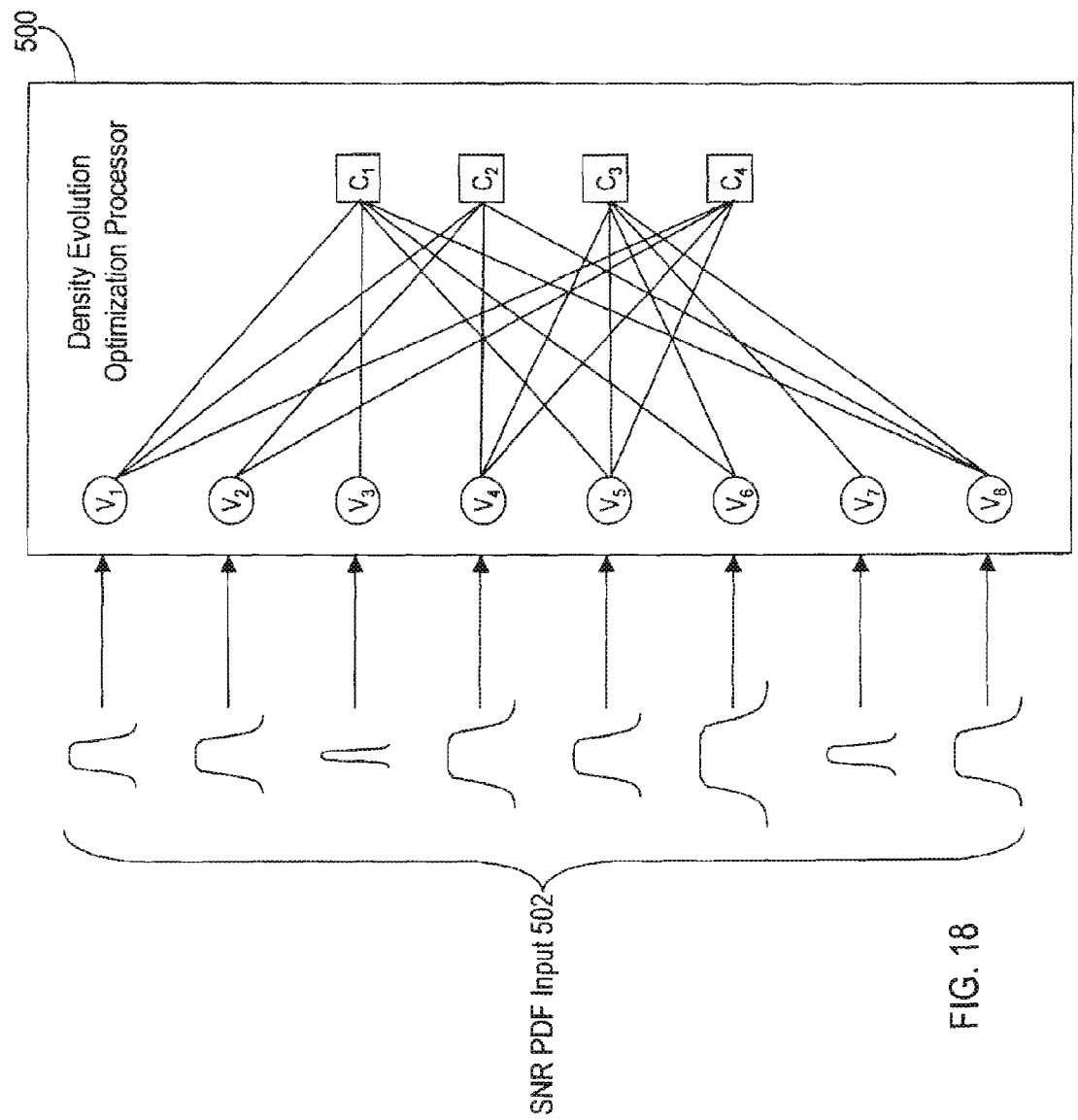
FIG. 18 shows an exemplary density evolution optimization processor.

The assignment of bits of the codeword to variable nodes of a Tanner graph for a particular H-matrix may be optimized using a density evolution process. As shown in FIG. 18, a density evolution optimization processor 500 receives SNR PDFs 502 as inputs and associates each of the SNR PDFs with a variable node based on results of the iterative message passing process discussed above. Instead of using PDFs indicating whether a variable node is a 1 or a 0, the SNR PDFs are loaded into the variable nodes. After iterating for a fixed number of cycles through steps 1 and 2, an average PDF may be derived for each variable node that indicates the confidence level of correctness of each variable node value. Thus, by using this indication as a feedback parameter, density evolution optimization processor 500 may search for a codeword bits to variable nodes mapping that achieves greater confidence levels.

Density evolution optimization processor 500 can be designed not to be limited to assigning variable nodes having a same degree to inputs having a same SNR PDF (SNR). Thus, the codeword-to-variable node mapping may result in an average degree $\bar{d}_i$ corresponding to a particular $SNR_i$. For codewords having $m_{ji}$ bits assigned to variable nodes of degree j corresponding to $SNR_i$, density evolution optimization processor 500 may achieve an average degree $\bar{d}_i$ corresponding to $SNR_i$ as follows:

$$\bar{d}_i = \frac{1}{n_i} \sum_{j=1}^{L} j \cdot m_{ji}, \tag{3}$$

where $n_i$ is a total number of bits of the codeword that corresponds to $SNR_i$. Density evolution optimization and its extensions, therefore, can be used to directly relate variable node degrees and levels of error correction (e.g., SNR profiles).

This optimizer can output the values of $m_{ji}$ for all i and j. According to this output, we assign $m_{ji}$ variable nodes of degree j to domains corresponding to $SNR_i$. Typically, the average degrees corresponding to $SNR_1$, $SNR_2$, ..., $SNR_k$ satisfy $\bar{d}_1 > \bar{d}_2 > \ldots > \bar{d}_k$ (assuming that $SNR_1 < SNR_2 < \ldots < SNR_k$). However, it should be understood that the density evolution optimization should result in optimized degrees/assignment, regardless of whether this statement is true or not.

Figure 19:
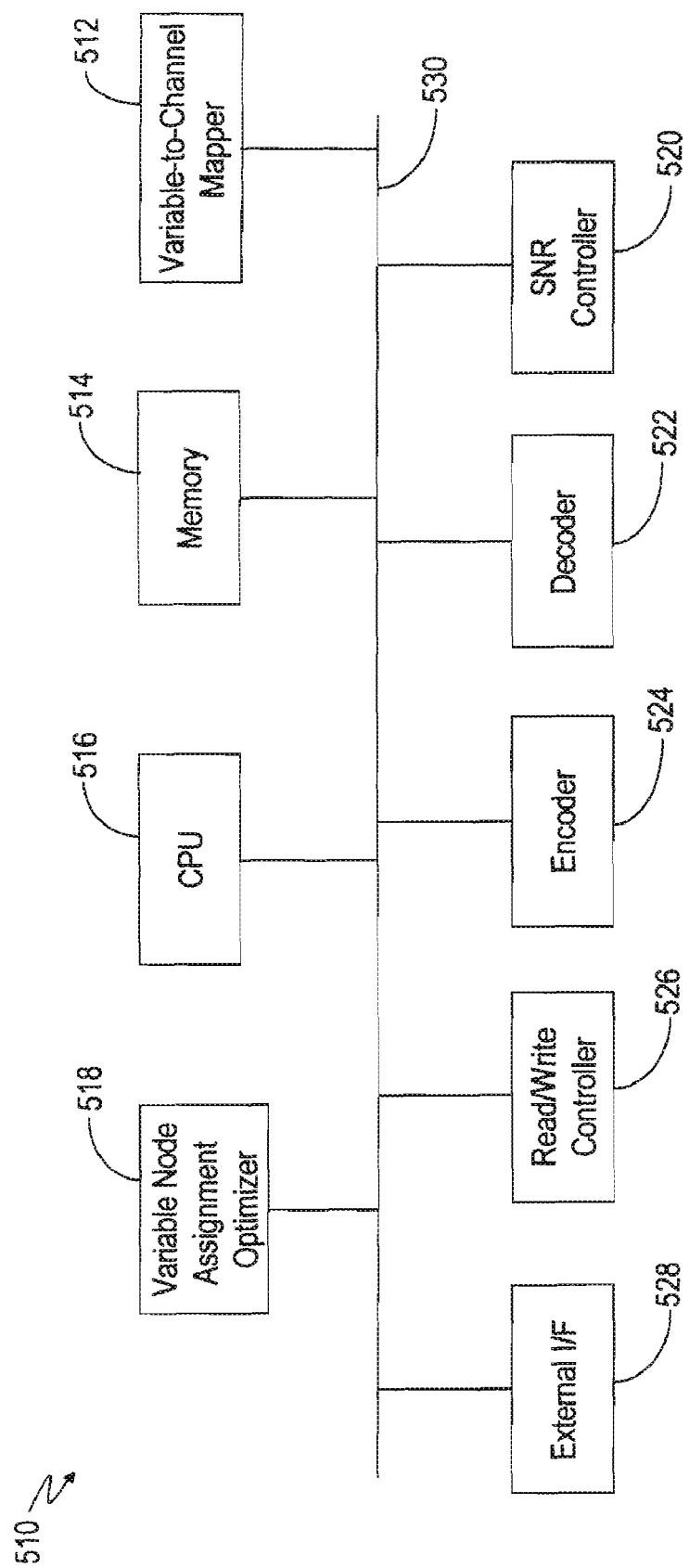
FIG. 19 shows a block diagram of an exemplary ERSEC system.

FIG. 19 shows a block diagram of an exemplary ERSEC system 510 that includes a variable-to-channel mapper 512, memory 514, CPU 516. variable node assignment optimizer 518, SNR controller 520, decoder 522, encoder 524, read/write controller 526 and optionally,, an external I/F 528. The above components are coupled together via a bus 530. External I/F 528 may include a user interface, a network interface, etc. to permit communications with external sources such as receiving commands from a user, search for and download files from a website, etc., for example. While FIG. 19 shows ERSEC system 510 in a bus architecture configuration, any hardware architecture may be used as dictated by actual implementation circumstances. Additionally, while various functions are shown as separate components, the functions performed by these components may be performed in software executing in CPU 516, for example, or in one or more of the other components that include processing power. Any of the components implemented in hardware may be implemented using PALs, PLIs, Application Specific Integrated Circuits (ASICs) or other hardware techniques.

CPU 516 performs general ERSEC system control functions such as initializing the other components 512 and 518-528, for example. Coordination among these other components 512 and 518-528 may be achieved by exchanging messages with CPU 516. CPU 516 may also regulate periodic SNR detection executed by SNR controller 520 for example. As noted above, CPU 516 may also perform a part or all of the processing associated with any of the components 512 and 518-528, if necessary.

SNR controller 520 obtains an SNR profile for a channel. The SNR profile may be generated by a manufacturer of a storage media channel, for example, and SNR controller 520 may retrieve from an outside source such as a manufacturer's website or from the storage media channel itself and place the SNR profile in memory 514 for use by other components 512 and 516-526. SNR controller 520 may estimate the SNR profile for a channel based on characteristics of the channel. For example, SNR controller 520 may transmit and receive test data via the channel to determine channel parameters for generating an estimated SNR profile. ERSEC system 100 may adaptively adjust levels of error corrections by detecting the SNRs of a channel periodically, in real time (i.e., adjusting error correction levels continuously based on most current detected data), on command, or by any other technique, so that consecutive codewords may be encoded differently based on the detected SNR profile.

Variable-to-channel mapper 512 may input an SNR profile from memory 514, for example, and information relating to variable nodes and their associated degrees. Variable-to-channel mapper 512 may perform the mapping function using a table-look-up process where a codeword bit is assigned to a variable node based on the available variable nodes having a closest degree to a desired degree. The desired degree may be obtained based on a degree-to-SNR table that may be generated before the codeword bit-to-variable node assignment process. For example, a predetermined degree-to-SNR table may be generated by an ERSEC system designer and stored in memory 514. Also, these two tables may be combined beforehand into an SNR-to-variable node table so that codeword bit-to-variable node assignments may be quickly performed especially in adaptive ERSEC system implementations.

Variable-to-channel mapper 512 may send mapping information to variable node assignment optimizer 518 to obtain an optimized codeword bit-to-variable node assignment. To facilitate convergence, variable-to-channel mapper 512 may send an initial assignment based on the table-look-up process to variable node assignment optimizer 518. When variable node assignment optimization is completed, variable node assignment optimizer 500 may return the optimized assignment to variable-to-channel mapper 512 so that a codeword permutation table may be stored in memory 514 or loaded into encoder 524 and decoder 522 for encoding and decoding processes.

When input data is ready to be encoded, encoder 524 generates codewords based on the generator matrix G and permutes the generated codeword bits according to the codeword permutation table. Encoder 524 outputs the permutation result to read/write controller 526 for writing to the channel. Alternatively, encoder 524 may only generate the codeword and leave the permutation process to be performed by read/write controller 526.

When data is received from read/write controller 526, decoder 522 permutes the data to convert the data into a received-codeword and performs the iterative message passing process to generate a retrieved-codeword. As noted above, the iterative message passing process performs error correction. After generating the retrieved-codeword, decoder 522 performs the required matrix operations to obtain decoded-data from the retrieved-codeword. If the decoding procedure is successful the decoded-data is identical to the input data received by encoder. This should happen with high probability so that low decoded BERs are achieved.

Based on the above described functions, ERSEC system 100 may first determine the SNR profile for a channel via an SNR controller 520 and determine a codeword bit-to-channel mapping based on the SNR profile and a pixel arrangement of the codeword, for example. In holographic recording channels, the pixel arrangement may be a two-dimensional pixel image, and a pixel-to-SNR domains of the channel may be obtained. CPU 516 may either select an H-matrix out of many possible H-matrices, or retrieve an H-matrix from memory 514 that may have been pre-specified by an ERSEC system designer. When the pixel-to-channel mapping and the H-matrix are obtained, ERSEC system 100 may determine a variable-to-channel mapping via variable-to-channel mapper 512 that outputs a codeword bits permutation table for initializing encoder 524, decoder 522, and/or read/write controller 526. The permutation table together with the H-matrix implements a higher level of error correction to codeword bits that are expected to experience lower SNRs, and lower level of error correction to codeword bits that are expected to experience higher SNRs. When input data is ready for writing, encoder 524 encodes the input data as discussed above and sends the encoded data to read/write controller 526 for writing to the channel. When read/write controller 526 receives data from the channel, the received data is sent to decoder 522 to obtain decoded-data. As noted above, the permutation process may be performed by read/write controller 526. Thus the permutation table may be used only in read/write controller 526. Encoder 524 may output codewords, and decoder 522 may receive received-codewords.

Figure 20:
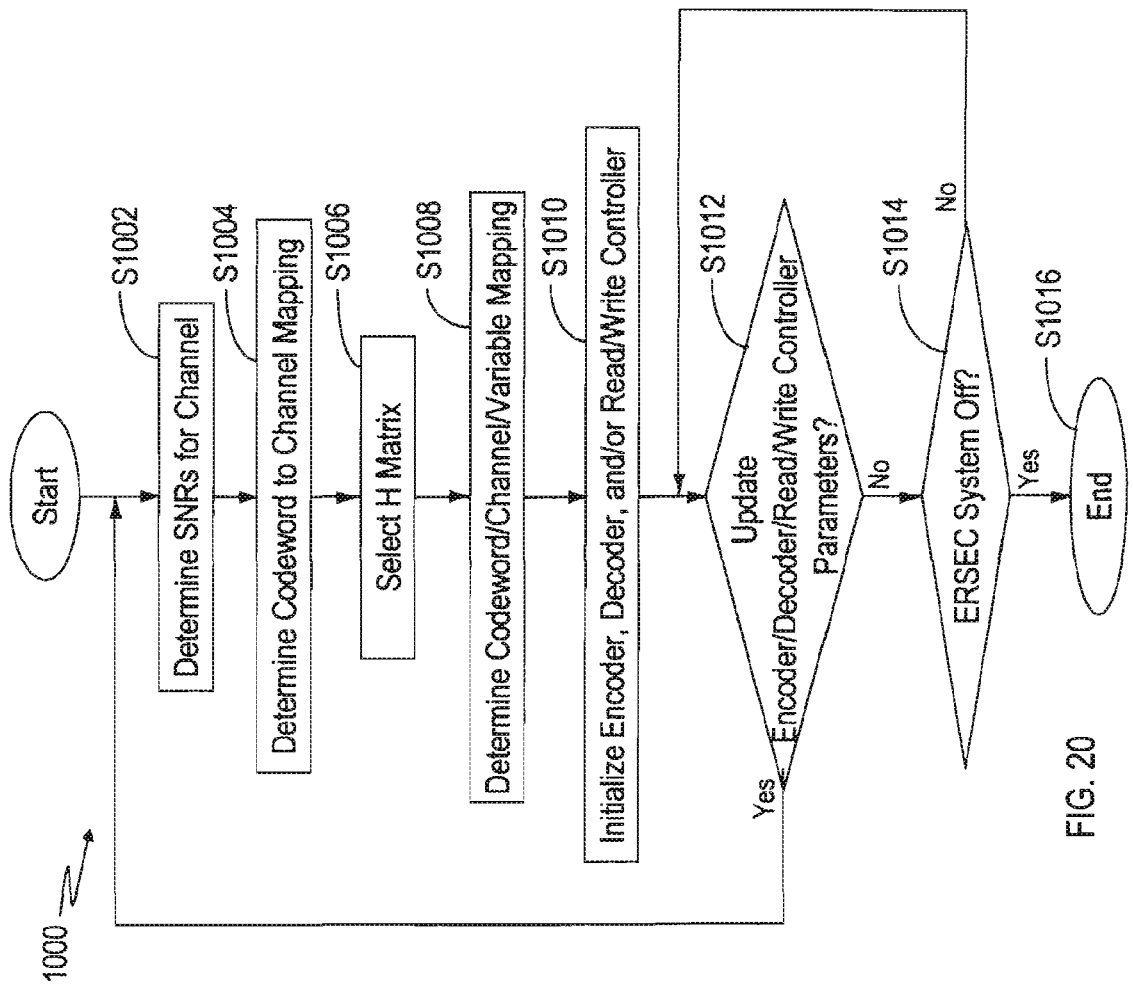
FIG. 20 shows a flow chart showing an exemplary encoder/decoder parameter update process.

FIG. 20 is a flowchart showing an exemplary ERSEC process 1000. In step S1002, the process determines SNRs for a channel. Once the SNRs are determined, the process goes to step S1004. In step S1004, the process determines a codeword-to-channel mapping, and goes to step S1006, In step S1006, the process selects an H-matrix, and goes to step S1008.

In step S1008, the process determines a codeword-to-variable node mapping and generates a permutation table, and goes to step S1010. In step S1010, the process initializes an encoder, a decoder and/or a read/write controller with the permutation table, and goes to step S1012. In step S1012, the process determines whether the encoder, the decoder and/or read/write controller parameters need to be updated. If the parameters need updating, the process returns to step S1002. Otherwise, the process goes to step S1014. In step S1014, the process determines whether the ERSEC system is turned off. If the ERSEC system is turned off, the process returns to step S1012. Otherwise, the process goes to step S1016 and ends.

Figure 21:
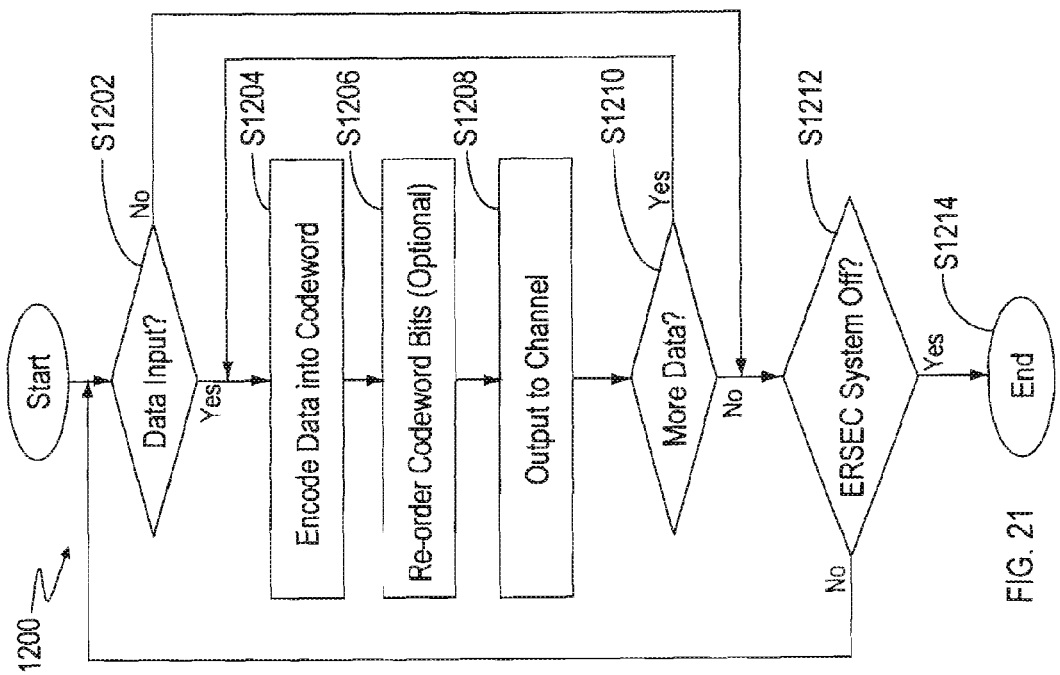
FIG. 21 shows a flow chart showing an exemplary encoding process.

FIG. 21 is a flowchart 1200 showing an exemplary process for encoding data. In step S1202, the process determines whether input data is available to be encoded. If input data is available, the process goes to step S1204. Otherwise, the process goes to step S1214. In step S1204, the process encodes the input data into a codeword, and goes to step S1206. In step S1206, the process re-orders the codeword bits based on the permutation table generated in step S1008 of flowchart 1000, and goes to step S1208. In step S1208, the process outputs the permuted codeword bits to the channel, and goes to step S1210. Step S1206 may be omitted if read/write controller 526 performs the permutation process, and step 1208 will output codeword bits instead of the permuted codeword bits.

In step S1210, the process determines whether more input data is available. If more data is available, the process returns to step S1204. Otherwise, the process goes to step S1212. In step S1212, the process determines whether the ERSEC system is turned off. If turned off, the process goes to step S1214 and ends. Otherwise, the process returns to step S1202.

Figure 22:
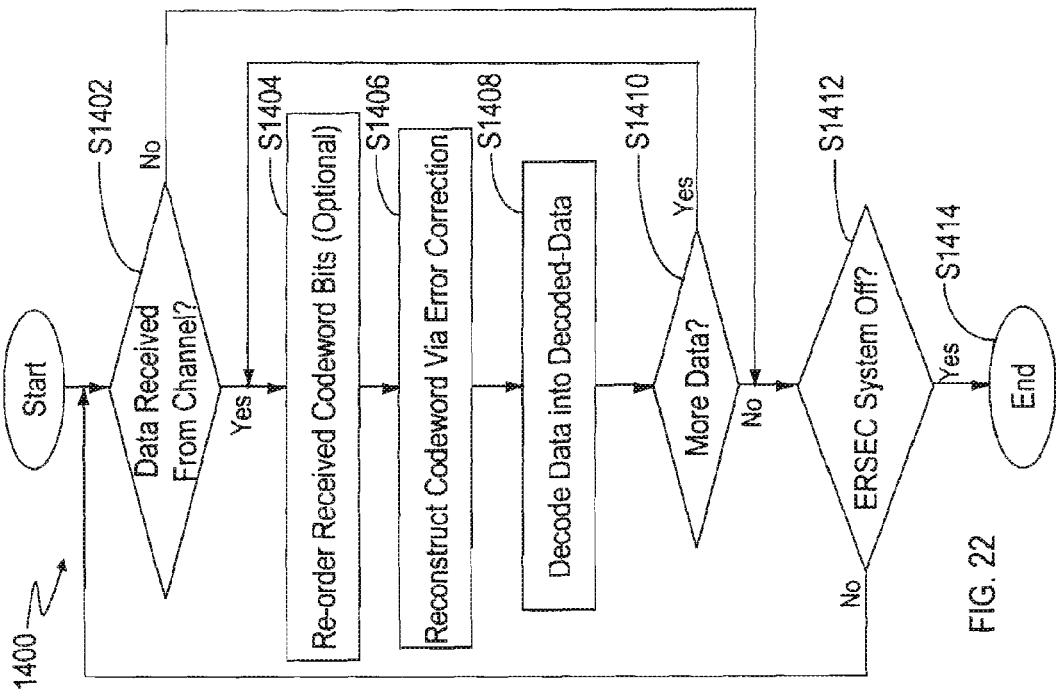
FIG. 22 shows a flow chart showing an exemplary decoding process.

FIG. 22 is a flowchart 1400 showing an exemplary process for decoding. In step S1402, the process determines whether data has been received from a channel. If data has been received, the process goes to step S1404. Otherwise, the process goes to step S1412. In step S1404, the process re-orders bits of the received-codeword bits based on the permutation table generated in step S1008 of flowchart 1000, and goes to step S1406. As noted above, read/write controller 526 may have already permuted the data received from the channel into received-codewords, and decoder 522 need not perform the permutation process. In step S1406, the process generates a reconstructed-codeword based on the iterative message passing process, and goes to step S1408.

In step S1408, the process decodes the reconstructed-codeword into decoded-data, and goes to step S1410. In step S1410, the process determines whether there is more data received from the channel. If more data is received, the process returns to step S1404. Otherwise, the process goes to step S1412. In step S1412, the process determines whether the ERSEC system is turned off. If turned off, the process goes to step S1414 and ends. Otherwise, the process returns to step S1402.

It should be understood that the above description involving a holographic storage device is merely for illustrative purposes. The ERSEC system can be used in any application where data is transmitted over a channel having multiple SNRs across spatial or temporal dimensions, or both. An example of the application of the ERSEC system to a channel that has an SNR that varies over time is shown in FIG. 2, for example. The ERSEC system may be applied to channels where the SNR varies both spatially and with time such as a recording media that has time varying SNRs (i.e., media stability changes with time).

The ERSEC system may be embodied in a digital versatile disc (DVD) drive (not shown). The ERSEC system may implement either or both signal processing and/or control circuits and/or mass data storage of the DVD drive. The signal processing and/or control circuit and/or other circuits in the DVD may process data, perform error correction coding and/or encryption, perform calculations, and/or format data that is read from and/or data written to an optical storage medium. In some implementations, the signal processing and/or control circuit and/or other circuits in the DVD can also perform other functions such as encoding and/or decoding and/or any other signal processing functions associated with a DVD drive.

The DVD drive may communicate with an output device such as a computer, television or other device via one or more wired or wireless communication links. The DVD may communicate with mass data storage that stores data in a nonvolatile manner. The mass data storage may include a hard disk drive (HDD). The HDD may be a mini HDD that includes one or more platters having a diameter that is smaller than approximately 1.8". The DVD may be connected to memory, such as RAM, ROM, low latency nonvolatile memory such as flash memory, and/or other suitable electronic data storage.

The ERSEC system may be embodied in a cellular phone that may include a cellular antenna. The ERSEC system may implement either or both signal processing and/or control circuits, a WLAN interface and/or mass data storage of the cellular phone. In some implementations, the cellular phone includes a microphone, an audio output such as a speaker and/or audio output jack, a display and/or an input device such as a keypad, pointing device, voice actuation and/or other input device. The signal processing and/or control circuits and/or other circuits in the cellular phone may process data, perform error correction coding and/or encryption, perform calculations, format data and/or perform other cellular phone functions.

The cellular phone may communicate with mass data storage that stores data in a nonvolatile manner such as optical and/or magnetic storage devices, for example, HDD and/or DVDs. The cellular phone may be connected to a memory such as RAM, ROM, low latency nonvolatile memory such as flash memory and/or other suitable electronic data storage. The cellular phone also may support connections with a WLAN via a WLAN network interface.

The foregoing detailed description of the ERSEC system has been presented for purposes of illustration and description. It is not intended to be exhaustive or to limit the ERSEC system to the precise embodiments disclosed. Many modifications and variations are possible in light of the above teaching. The described embodiments were chosen in order to best explain the principles of the ERSEC system and its practical application to thereby enable others skilled in the art to best utilize the ERSEC system in various embodiments and with various modifications as are suited to the particular use contemplated. It is intended that the scope of the ERSEC system be defined by the claims appended hereto.

What is claimed is:

1. A method for error correction coding, comprising:
   obtaining a signal-to-noise ratio (SNR) profile for a channel that includes different SNR domains;
   assigning at least two portions of a codeword to different SNR domains of the channel by a controller;
   ordering the SNR domains according to SNR magnitudes; and allocating by the controller higher levels of error correction to portions of the codeword that are assigned to the SNR domains having smaller SNR magnitudes.

2. The method of claim 1, further comprising generating the codeword using at least one of Hamming coding, Reed-Solomon coding, and regular low-density parity-check (LDPC) coding.

3. The method of claim 1, wherein allocating by the controller the higher levels of error correction to the portions of the codeword that are assigned to the SNR domains having smaller SNR magnitudes, further comprises:
allocating different codes to the portions of the codeword that are assigned to the SNR domains having smaller SNR magnitudes.

4. The method of claim 1, further comprising generating the codeword using irregular LDPC coding.

5. The method of claim 4, further comprising:
identifying variable nodes based on a parity-check matrix for the irregular LDPC coding; and
assigning variable nodes having higher degrees to the portions of the codeword that are assigned to the SNR domains having smaller SNR magnitudes.

6. The method of claim 5, further comprising:
permuting bits of the codeword based on the assignment between the portions of the codeword and the variable nodes.

7. The method of claim 5, further comprising:
selecting an H-matrix that includes a mixture of variable node degrees that is consistent with an allocation of levels of error correction; and
optimizing an assignment of the portions of the codeword to variable nodes of the selected H-matrix based on density evolution.

8. The method of claim 1, the obtaining the SNR profile comprising one or more of:
estimating the SNR magnitudes of the channel;
reading the SNR profile from a storage medium;
receiving the SNR profile from an external source; and
calculating the SNR magnitudes of the channel based on test results.

9. The method of claim 8, further comprising:
updating the SNR profile at one of periodically, in real time, and upon command.

10. The method of claim 9, further comprising adaptively changing the allocation of the levels of error correction for portions of the codeword based on an updated SNR profile.

11. An error rate sensitive error correction device, comprising:
a memory that stores a signal-to-noise ratio (SNR) profile for a channel that includes different SNR domains; and
a controller coupled to the memory, the controller:
assigns at least two portions of a codeword to different domains of the channel;
orders the SNR domains according to SNR magnitudes; and
allocates higher levels of error correction to portions of the codeword that are assigned to the SNR domains having smaller SNR magnitudes.

12. The error rate sensitive error correction device of claim 11, wherein the controller generates the codeword using at least one of Hamming coding, Reed-Solomon coding, and regular LDPC coding.

13. The error rate sensitive error correction device of claim 11, wherein the controller:
allocates different error correction codes to the portions of the codeword that are assigned to the SNR domains having smaller SNR magnitudes.

14. The error rate sensitive error correction device of claim 11, wherein the controller generates the codeword using irregular LDPC coding.

15. The error rate sensitive error correction device claim 14, wherein the controller:
identifies variable nodes based on a parity-check matrix for the irregular LDPC coding; and
assigns variable nodes having higher degrees to the portions of the codeword that are assigned to the SNR domains having smaller SNR magnitudes.

16. The error rate sensitive error correction device of claim 15, wherein the controller:
permutes bits of the codeword based on the assignment between the portions of the codeword and the variable nodes.

17. An error rate sensitive error correction device, comprising:
means for obtaining a signal-to-noise ratio (SNR) profile for a channel that includes different SNR domains;
means for assigning at least two portions of a data codeword to different SNR domains of the channel;
means for ordering the SNR domains according to SNR magnitudes; and
means for allocating higher levels of error correction to portions of the codeword that are assigned to the SNR domains having smaller SNR magnitudes.

18. The error rate sensitive error correction device of claim 17, further comprising means for generating the codeword using irregular LDPC coding.

19. The error rate sensitive error correction device of claim 18, further comprising:
means for identifying variable nodes based on a parity-check matrix for the irregular LDPC coding; and
means for assigning variable nodes having higher degrees to the portions of the codeword that are assigned to the SNR domains having smaller SNR magnitudes.

20. The error rate sensitive error correction device of claim 17, further comprising:
means for allocating different error correction codes to the portions of the codeword that are assigned to the SNR domains having smaller SNR magnitudes.

21. The error rate sensitive error correction device of claim 19 further comprising:
means for permuting bits of the codeword based on the assignment between the portions of the codeword and the variable nodes.

22. The error rate sensitive error correction device of claim 17, the means for obtaining the SNR profile comprising one or more of:
means for estimating the SNR magnitudes of the channel;
means for reading the SNR profile from a storage medium;
means for receiving the SNR profile from an external source; and
means for calculating the SNR magnitudes of the channel based on test results.

23. The error rate sensitive error correction device of claim 22, further comprising:
means for updating the SNR profile at one of periodically, in real time, and upon command.

24. The error rate sensitive error correction device of claim 23, further comprising means for adaptively changing an allocation of the levels of error correction for the portions of the codeword based on an updated SNR profile.

25. The error rate sensitive error correction device of claim 19, further comprising:

means for selecting an H-matrix that includes a mixture of variable node degrees that is consistent with an allocation of levels of error correction; and means for optimizing an assignment of the portions of the codeword to variable nodes of the selected H-matrix based on density evolution.

* * * * *